(12) United States Patent
Palinkas

(10) Patent No.: US 6,476,688 B2
(45) Date of Patent: Nov. 5, 2002

(54) FILTER ASSEMBLY

(75) Inventor: Raymond W. Palinkas, Canastota, NY (US)

(73) Assignee: John Mezzalingua Assoc., Inc., East Syracuse, NY (US)

(*) Notice: Subject to any disclaimer, the term of this patent is extended or adjusted under 35 U.S.C. 154(b) by 0 days.

(21) Appl. No.: 10/052,155

(22) Filed: Jan. 15, 2002

(65) Prior Publication Data

US 2002/0057140 A1 May 16, 2002

Related U.S. Application Data

(63) Continuation of application No. 09/533,268, filed on Mar. 20, 2000, now Pat. No. 6,380,826.

(51) Int. Cl.[7] .................................................. H03H 7/01
(52) U.S. Cl. ........................ 333/175; 333/185; 439/620
(58) Field of Search ................................ 333/167, 175, 333/185, 206; 439/620

(56) References Cited

U.S. PATENT DOCUMENTS

| | | | |
|---|---|---|---|
| 3,227,975 A | 1/1966 | Hewlet et al. ................. 333/81 |
| 3,426,311 A | 2/1969 | Gifford ......................... 439/63 |
| 4,097,894 A | 6/1978 | Tanner et al. ............... 358/118 |
| 4,666,230 A | 5/1987 | Gartzke ....................... 439/578 |
| 4,701,726 A | 10/1987 | Holdsworth ................ 333/185 |
| 4,845,447 A | 7/1989 | Holdsworth ................ 333/167 |
| 4,901,043 A | 2/1990 | Palinkas ...................... 333/175 |
| 5,039,961 A | * 8/1991 | Veteran ..................... 333/81 A |
| 5,150,087 A | 9/1992 | Yoshie et al. ................ 333/185 |
| 5,278,525 A | 1/1994 | Palinkas ...................... 333/175 |
| 5,432,488 A | 7/1995 | Kotani et al. ................ 333/167 |
| 5,662,494 A | 9/1997 | Zennamo, Jr. et al. ....... 439/589 |
| 5,770,983 A | 6/1998 | Zennamo, Jr. et al. ....... 333/168 |
| 6,165,019 A | 12/2000 | Kha et al. .................... 439/620 |

* cited by examiner

Primary Examiner—Benny T. Lee
Assistant Examiner—Stephen E. Jones
(74) Attorney, Agent, or Firm—Duane Morris LLP; Steven E. Koffs

(57) ABSTRACT

A filter assembly includes a printed circuit board having a filtering circuit and a ground plane. A body receives the printed circuit board. The printed circuit board has at least one tab, and the body has a respective slot for receiving each tab, aligning the printed circuit board with the body. The body is shaped so as to provide a first cable connector at one end. The ground plane of the printed circuit board is connected to an inner wall of the body by solder. A nut fits on an end of the body opposite the cable connector of the body. The nut provides a second cable connector at an end opposite the first cable connector. The nut is connected to the body by solder along a periphery of the nut to form a water tight seal. The solder joining the nut to the body is continuous with the solder connecting the ground plane to the body. A pair of terminals are electrically connected at opposite ends of the printed circuit board. Each of the terminals has a slot sized to receive a respective end of the printed circuit board and may form a friction fit between the printed circuit board and the terminals.

19 Claims, 4 Drawing Sheets

FILTER ASSEMBLY

RELATED APPLICATION DATA

This application is a continuation of U.S. patent application Ser. No. 09/533,268, filed Mar. 20, 2000, now U.S. Pat. No. 6,380,826.

FIELD OF THE INVENTION

The present invention relates to filters for the cable television industry.

DESCRIPTION OF THE RELATED ART

Filters and traps are well known in the cable television (CATV) industry. For example, an electrical filter for CATV use is described in U.S. Pat. Nos. 4,901,043 and 5,278,525 by the present inventor, which are expressly incorporated by reference herein.

Filters or traps are often used to limit access to specific channels to customers who have subscribed to those channels. The filters may block out frequencies corresponding to channels for which the customer has not paid. Alternatively, if the premium channels have a scrambling frequency imposed on them, the filters may block out the scrambling signals, only for the customers who have subscribed to the services.

It is common to use a plurality of filters in series. Filters having different pass bands may be combined to admit/restrict a combination of frequencies. Alternatively, more than one filter having the same pass band may be used to provide increased attenuation outside of the pass band. The multiplicity of filters for a given customer are typically placed inside a housing, which may be mounted outside of the customer's house on a pole or above ground. As the number of channels increases, it is desirable to decrease the size of the filters, so that more filters can be stored inside the housing without increasing the size of the housing.

At the same time, the requirements for integrity and ease of fabrication of the filter package have not been reduced. Therefore, an improved filter is desired.

SUMMARY OF THE INVENTION

The present invention is a filter assembly, comprising a printed circuit board having a filtering circuit and a ground plane thereon. A body receives the printed circuit board. The body is shaped so as to provide a first cable connector at an end thereof. The ground plane of the printed circuit board is connected to an inner wall of the body by solder. A nut fits on an end of the body opposite the cable connector of the body. The nut provides a second cable connector at an end thereof opposite the first cable connector. The nut is connected to the body by solder along a periphery of the nut to form a water tight seal.

DETAILED DESCRIPTION

Figure 1:
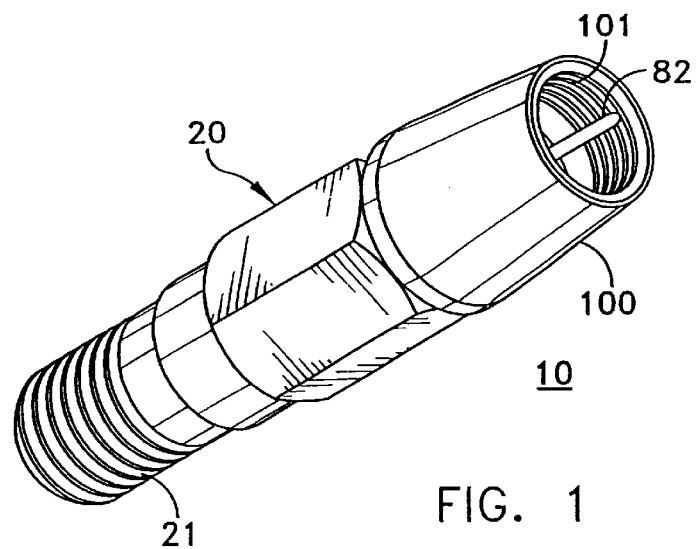
FIG. 1 is an isometric view of an exemplary filter assembly according to the invention.
Figure 2:
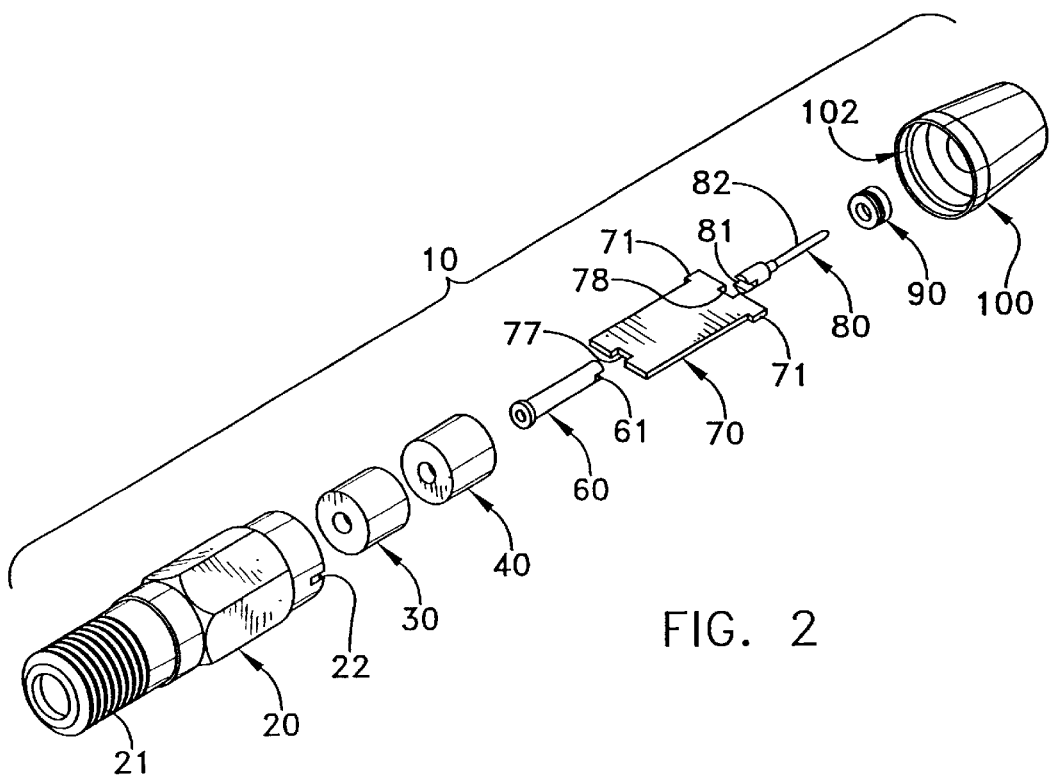
FIG. 2 is an exploded view of the filter assembly of filter 1.
Figure 3:
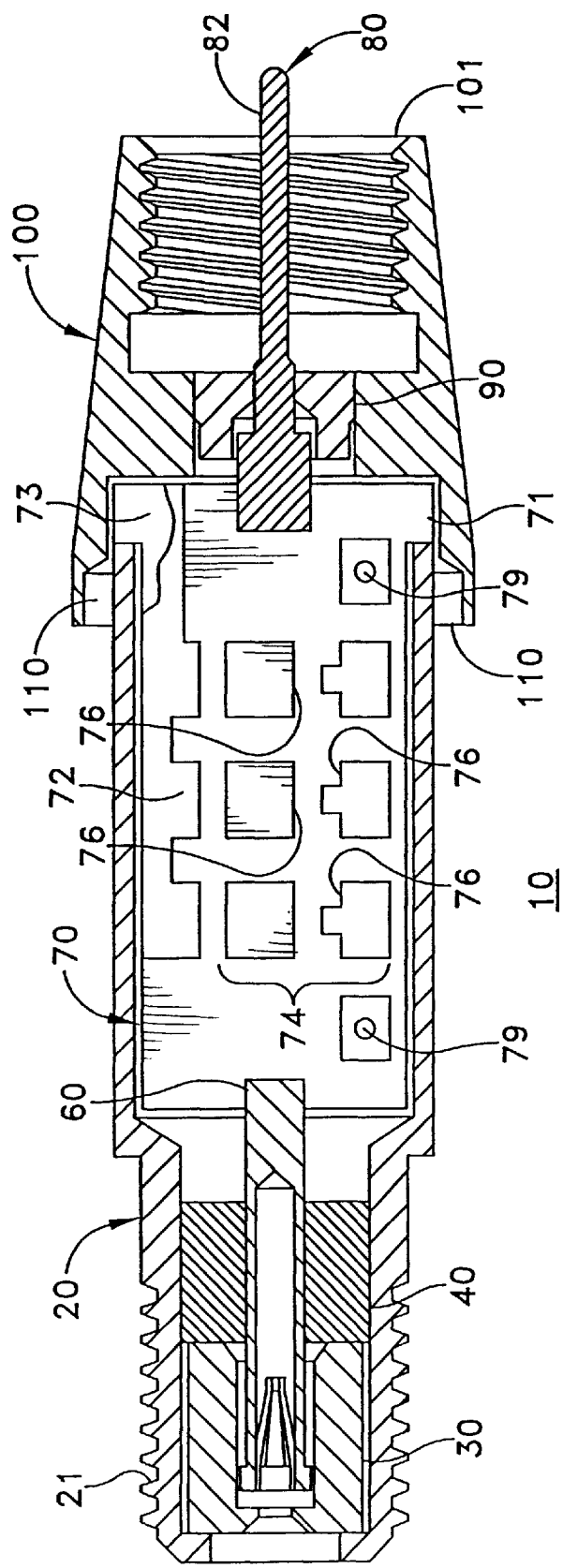
FIG. 3 is a cross sectional view of the filter assembly of filter 1.

FIGS. 1–3 show an exemplary device 10 according to the present invention, which may be a filter. The exemplary filter 10 provides high level performance in a small enclosure. The filter 10 is moisture and water resistant, and is capable of withstanding tension (pull-out force) of at least 0.9 Newtons (0.44 pounds). Exemplary filter 10 blocks frequencies in the range from 5–40 MHz, with at least −40 dB attenuation, while providing low insertion loss in the pass band from 54–1000 MHz, with a maximum of −1.0 dB attenuation. Filters providing a variety of cutoff ranges may be designed according to the present invention. For example, an alternative filter design blocks frequencies in the range from 5–55 MHz, while providing a pass band of 65–1000 MHz. Other pass bands are also contemplated.

Figure 6:
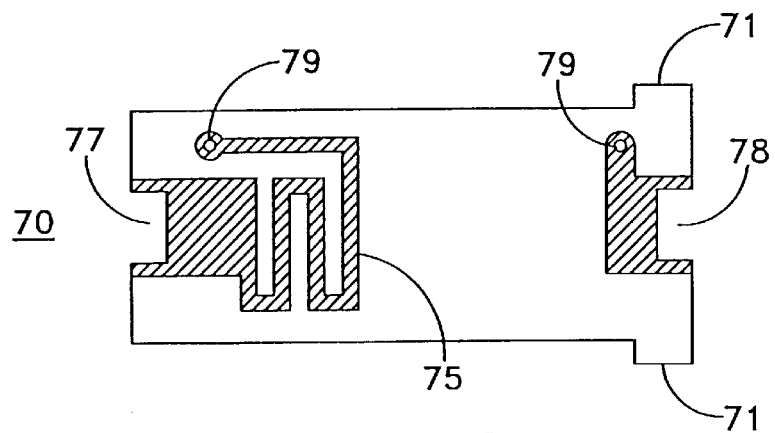
FIG. 6 is a bottom plan view of the printed circuit board shown in FIG. 3.

The filter assembly 10 includes a printed circuit board 70 having a filtering circuit 74 and a ground plane 72, as shown in FIG. 3. The printed circuit board is made from a conventional substrate material, with stripline circuit patterns printed thereon using a conventional metallization and/or etching process. The exemplary printed circuit board is formed from 0.8 millimeter FR4 with 1 ounce copper, double sided. The printed circuit board 70 has at least one tab 71. The exemplary printed circuit board 70 has two tabs 71 on opposite sides thereof. The exemplary filtering circuit 74 includes a plurality of bonding pads 76 on which discrete circuit components (not shown) are mounted. The filtering circuit 74 also includes a stripline circuit path 75 (shown in FIG. 6) on its bottom side providing sufficient inductance to provide a 75 Ω impedance. The circuitry on the two sides of the printed circuit board 70 are connected by plated through holes 79. Although the exemplary embodiment uses the stripline circuit path 75 to form an inductor, one of ordinary skill could readily incorporate a discrete surface mounted inductor package onto the printed circuit board 70.

The housing of the filter 10 includes a body 20 and a nut 100. The body 20 includes means for aligning the printed circuit board 70 in the body. A variety of alignment means may be used. For example, the body 20 of FIGS. 1–3 has a respective slot 22 for receiving each of the at least one tab(s) 71 on the printed circuit board 70, thereby aligning the printed circuit board 70 with the body 20, before and during subsequent soldering. Alignment of the printed circuit board 70 ensures that the terminals 60 and 80 are aligned for proper mechanical fit within the insulators 30, 90 and elastomeric seal 40. The slots 22 provide mechanical support for the printed circuit board 70 and relieve the stress of the solder joints. The exemplary body 20 is formed from C36000 brass, (ASTM B16, ½ hard), but other materials may be used.

Other variations of the alignment structure are shown in FIGS. 7A–7F. Each of FIGS. 7A–7F shows a portion of a body having a respectively different alignment structure. All other features of the body may be the same as shown in FIGS. 1–3, and a description of those features is not repeated.

Figure 7A:
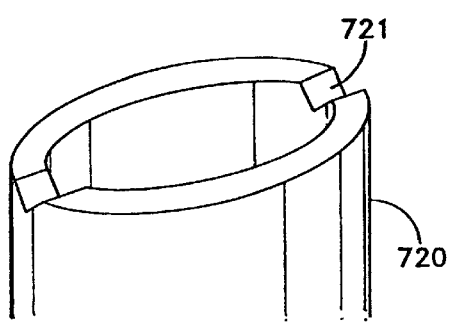
FIGS. 7A–7F show six variations of the exemplary structures for aligning the printed circuit board of FIG. 6 in the body.

For example, as shown in FIG. 7A, instead of having slots 22 in the body 20 and tabs 71 on the printed circuit board 70, the body 720 may have a pair of radial grooves 721 formed at its end, for seating a pair of small tabs or extension members (smaller than tabs 71) of the printed circuit board 70'.

Figure 7B:
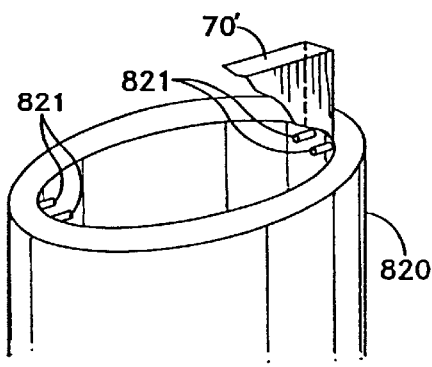

FIG. 7B shows a body 820 having a pair of raised nibs 821 forming a groove therebetween) for receiving and aligning the printed circuit board 70'. Note that nibs 821 need not extend longitudinally along the length of the body 820. FIG. 7D shows a body 920 having a pair of longitudinal ribs 921 forming a groove 922 therebetween. The ribs 921 may provide more positive alignment than the nibs 821. Both the nibs 821 and the ribs 921 can be formed in the same process as the bodies 820 and 920, respectively (e.g., by machining or molding).

Figure 7C:
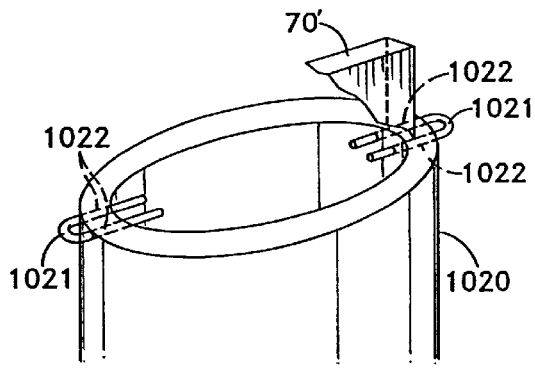
Figure 7D:
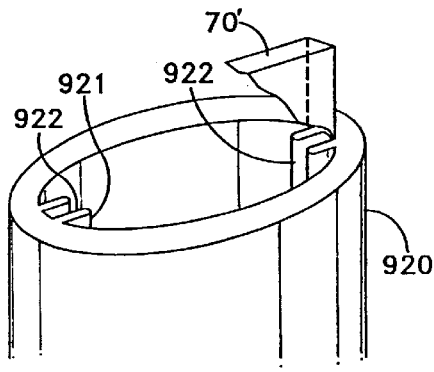

FIG. 7C shows a body 1020 having U-shaped pins 1021 that are located in openings 1022 on the side of the body to align the printed circuit board 70. The ends of each pin 1021 project radially inward towards the center of the body 1020. Functionally, the U-shaped pins 1021 are similar to the nibs, but the pins can be inserted after the body 1020 is formed. The pins 1021 may be friction fit into the body. Once the printed circuit board 70' is inserted, the pins 1021 may be soldered to the inside of the body while the board 70' is being soldered to the body.

Figure 7E:
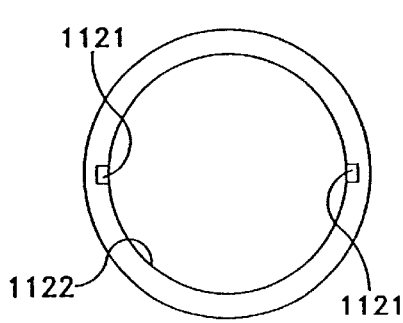

FIG. 7E shows another variation of the body 1120 in which longitudinal grooves are formed in the side wall 1122 of the body 1120. The longitudinal grooves 1121 function similarly to the space 922 between the raised ribs 921 in FIG. 7D.

Figure 7F:
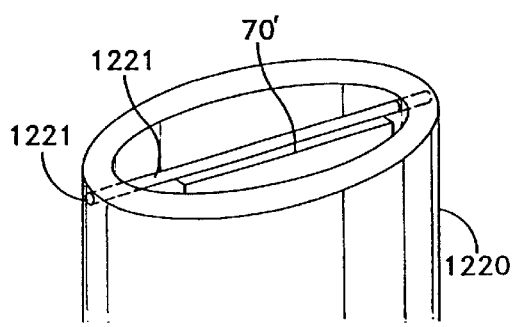

FIG. 7F shows a body 1220 having a straight pin 1221 traversing the internal body diameter to support and align the printed circuit board 70'. The pin 1221 may optionally be positioned slightly off center, so that the printed circuit board 70' can be centered and can rest against the pin 1221 at the same time.

In addition to the specific designs shown, other variations are also contemplated, including combinations of the designs shown in FIGS. 7A–7F. Also, although the figures only show the alignment structures at the end of the body, alignment features may be positioned remotely from the end.

Referring again to FIGS. 1–3, the body 20 is shaped so as to provide a first cable connector 21 at an end thereof. In the exemplary embodiment, body 20 has a male cable connector, but one of ordinary skill in the art can readily construct a body having a female connector thereon.

The nut 100 fits on an end of the body 20 opposite the cable connector 21 of the body. The nut 100 provides a second cable connector 101 at an end thereof opposite the first cable connector 21. Preferably, the connector 101 is of the opposite type from connector 21. For example, connector 21 is male, and connector 101 is female. The nut 100 is connected to the body 20 by solder 110 along a periphery of the nut to form a water tight seal. The exemplary nut 100 is formed from C36000 brass, (ASTM B16,½ hard), but other materials may be used. Although the exemplary nut 100 has a conical shape, a variety of nut shapes may be used. For example, the nut may be cylindrical, conical, or may have two or more sections, each having a different shape (e.g. a cylindrical section and a conical section). Other shapes are also contemplated The ground plane 72 of the printed circuit board 70 is connected to an inner wall of the body 20 by solder 73. Preferably, the solder 73 joining the nut 100 to the body 20 flows into, and is continuous with, the solder 110 connecting the ground plane 72 to the body 20.

A pair of terminals 60 and 80 are electrically connected at opposite ends of the printed circuit board 70. Each of the terminals 60 and 80 has a slot (61 and 81, respectively) sized to receive a respective end (77 and 78, respectively) of the printed circuit board 70. Preferably, the slot is used to form a friction fit between the printed circuit board and the terminals during assembly. The terminals are then soldered to the printed circuit board 70. The ends 77 and 78 of the printed circuit board 70 have electrical contact pads thereon, for forming electrical contact with the terminals 60 and 80. When assembled, the terminals 60 and 80 are in line with the printed circuit board 70. That is, the longitudinal axis of each terminal 60, 80 passes through a central longitudinal axis of the printed circuit board 70. The central longitudinal axis of the printed circuit board 70 is centrally located with respect to both the width and thickness of the printed circuit board.

One of the terminals 80 is a male terminal having a pin 82 extending away from the printed circuit board 70. The other terminal 60 is a female terminal capable of receiving a cylindrical pin. The pin may be, for example, of the size and shape of pin 82, and the pin may belong to either a cable connector or another filter having a connector end similar to connector 101. The terminals 60 and 80 may, for example be formed from C36000 brass, ASTM B16, ½ hard, with the contacts 65 of terminal 60 formed from beryllium copper alloy 172.

Figure 4:
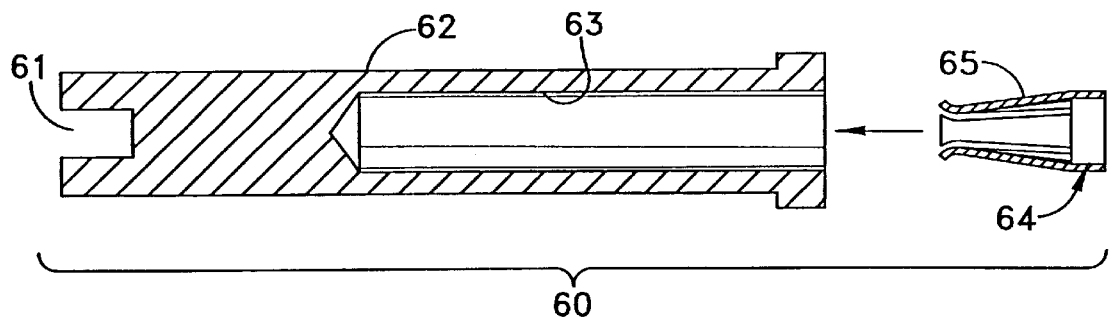
FIG. 4 is an exploded cross-sectional view of the female pin assembly shown in FIG. 2.
Figure 5:
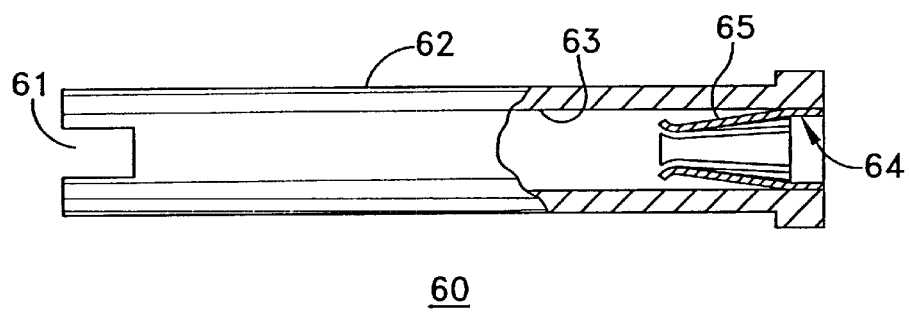
FIG. 5 is a partial cut-away view of the pin of FIG. 4 in its assembled configuration.

FIGS. 4 and 5 show the exemplary female terminal assembly 60. The female terminal 60 comprises an elongated cylindrical shaft 62 having the slot 61 at a first end thereof. The shaft 62 has an elongated central bore 63 at a second end opposite the first end having slot 61. The shaft 62 has a plurality of spring contacts 65 projecting into central bore 63, to mechanically and electrically contact the cylindrical pin.

The filter assembly 10 has an insulator 30, an elastomeric seal 40 at the end of the body 20 having the first connector 21. The insulator 30 may be formed of a polymer, such as natural TPX RT-18. The elastomeric seal 40 creates a water-tight seal between the body 20 and the terminal 60. The seal 40 may be formed of rubber, silicone, or other compressible insulating material. The exemplary seal 40 is formed from 30–40 durometer silicone rubber.

An insulator 90 is provided at the end of the nut 100 having the second connector 101. The insulator 90 creates a water-tight seal between the nut 100 and the terminal 80. Insulator 90 may be formed of a polymer, such as polypropylene.

The method for forming the filter assembly 10 includes the steps of: providing a printed circuit board 70 having a filtering circuit 74 and a ground plane 72 thereon; inserting the printed circuit board 70 into a body 20 shaped so as to provide a first cable connector 21 at an end thereof, connecting the ground plane 72 of the printed circuit board 70 to an inner wall of the body 20 by solder 73; fitting a nut 100 on an end of the body 20 opposite the first cable connector 21, the nut 100 providing a second cable connector 101 at an end thereof opposite the first cable connector 21; and connecting the nut 100 to the body 20 by solder 10 along a periphery of the nut, to form a water tight seal. As shown in FIGS. 1 and 3, when the filter is thus assembled, the slots 22 and tabs 71 are completely concealed and protected by the solder 110, providing a strong, tamper resistant joint.

The step of inserting the printed circuit board 70 into the body 20 preferably includes inserting the at least one tab 71 of the printed circuit board into the slot 22 of the body, thereby aligning the printed circuit board with the body.

The exemplary method further comprises a step of connecting a pair of terminals 60 and 80 electrically at opposite ends 77, 78 of the printed circuit board 70. The connecting step may include inserting respective ends 77 and 78 of the printed circuit board 70 into respective slots 61 and 81 on each respective terminal 60 and 80, so as to form a friction fit between the printed circuit board and the terminals. The friction fit maintains alignment between the printed circuit board 70 and the terminals 60 and 80. Either the printed circuit board 70 or the terminals 60, 80 may have solder applied thereon before assembly, in which case the solder is merely reflowed after the device is assembled, as described below. Alternatively, the terminals may be soldered (either manually or by an automated machine) after the terminals 60, 80 are press fitted onto the ends 77, 78 of the printed circuit board 70.

The exemplary method further comprises a step of compression fitting an elasotmeric seal 40 into the body 20 to create a water-tight seal between the body and the terminal 60, which is electrically connected to the printed circuit board.

Preferably, the solder 110 joining the nut 100 to the body 20 is continuous with the solder 73 connecting the ground plane 72 to the body. To achieve this result, solder 73 may be applied to the ground plane 72, and solder 110 may be applied to the inner rim 102 of the nut 100. The nut 100 is mechanically fitted to the body 20. Then the assembly is placed in a radio frequency (RF) oven to cause the solder to flow into the interface of the nut-body joint (shown by item 110 in FIG. 3). At the same time, the solder 73 and 110 flow together, forming a continuous electrical contact between the ground plane 72 and the periphery of body 20.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A filter assembly, comprising:
    a printed circuit board having a filtering circuit and a ground plane thereon, the printed circuit board having a central longitudinal axis, each end of the printed circuit board having a cut-out with an electrical contact pad adjacent thereto, each cut-out having a width;
    a pair of terminals in line with the central longitudinal axis of the printed circuit board and electrically connected at opposite ends of the printed circuit board, each of the terminals having a slot sized to receive a respective end of the printed circuit board, the slot of each terminal having a width that matches the width of a respective one of the cut-outs of the printed circuit board, so that each cut-out closely receives its respective terminal and locates that terminal in a direction parallel to the width of that cut-out;
    a body that receives the printed circuit board, the body shaped so as to provide a first cable connector at an end thereof; and
    a nut that fits on an end of the body opposite the cable connector of the body, the nut providing a second cable connector at an end thereof opposite the first cable connector.

2. The filter assembly of claim 1, wherein the terminals are soldered to the printed circuit board.

3. The filter assembly of claim 1, wherein the slot of each terminal forms a friction fit during assembly.

4. The filter assembly of claim 1, wherein the body has a pair of raised nibs forming a groove therebetween for receiving and aligning the printed circuit board.

5. The filter assembly of claim 1, wherein the body has a pair of longitudinal ribs forming a groove therebetween.

6. The filter assembly of claim 1, wherein the body has a pair of U-shaped pins that are located in openings on the side of the body to align the printed circuit board, each pin having ends projecting radially inward towards the center of the body.

7. The filter assembly of claim 1, wherein the body has a straight pin traversing an internal diameter of the body to support and align the printed circuit board, the pin being positioned sufficiently off center, so that the printed circuit board is centered and rests against the pin.

8. A filter assembly comprising:
    a filter body including a bore and a connector portion coupled to an end of the bore,
    a circuit board within the filter body,
    an insulator within the connector portion,
    a terminal that passes through the connector portion, passes at least partially through the insulator, and contacts the circuit board, and
    an elastomeric seal located entirely within an interior of the connector portion, between the insulator and a portion of the terminal that contacts the circuit board, wherein the elastomeric seal is a single-piece of material compression fit between the body and the terminal, the elastomeric seal providing a first water tight seal between the elastomeric seal and an interior surface of the connector portion and providing a second water tight seal between the elastomeric seal and the terminal.

9. The filter assembly of claim 8, wherein a longitudinal axis of the terminal is maintained centrally located with respect to both the width and thickness of the printed circuit board by a cut-out in the printed circuit board.

10. The filter assembly of claim 8, wherein the terminal is longitudinally positioned between the circuit board and a shoulder of the insulator.

11. The filter assembly of claim 10, wherein the terminal has a friction fit with the printed circuit board.

12. The filter assembly of claim 8, further comprising:
    a nut that fits on an end of the filter body opposite the connector portion, the nut providing a second connector portion;
    a second terminal that penetrates the second connector portion and contacts the circuit board at an end of the bore opposite the connector portion; and
    a second insulator formed of a polymer material and contained entirely within the nut, the second insulator forming a water tight seal with the nut and a water tight seal with the second terminal.

13. The filter assembly of claim 12, wherein the second insulator is formed of polypropylene.

14. The filter assembly of claim 12, wherein the printed circuit board has a stripline circuit pattern printed thereon, with a ground plane that is connected to both the body and the nut by solder.

15. The filter assembly of claim 14, wherein a portion of the ground plane is located on a tab extending laterally from the printed circuit board, and the body has a slot that receives the tab, the portion of the ground plane having the tab also having solder thereon continuous with solder connecting the nut to the body.

16. The filter assembly of claim 14, wherein when the filter is thus assembled, the slots and tabs are completely concealed and protected by the solder.

17. The filter assembly of claim 8, wherein the circuit board is entirely contained within the bore of the filter body.

18. The filter assembly of claims 8, wherein the elastomeric seal is formed of rubber silicone or other compressible insulating material.

19. A method of fabricating a filter assembly, comprising the steps of:
    (a) providing a filter body including a bore and a connector portion coupled to an end of the bore,
    (b) inserting an insulator within the connector portion;
    (c) compression fitting a separate elastomeric seal within the connector portion,
    (d) inserting a terminal through the connector portion, through the elastomeric seal, and at least partially through the insulator to contact the circuit board, the terminal being connected to a circuit board within the filter body, wherein the elastomeric seal is positioned entirely within an interior of the connector portion, between the insulator and a portion of the terminal that contacts the circuit board, and the elastomeric seal is a single-piece of material providing a first water tight compression seal between the elastomeric seal and an interior surface of the connector portion and providing a second water tight compression seal between the elastomeric seal and the terminal.

* * * * *